United States Patent [19]
Cheek et al.

[11] Patent Number: 6,075,417
[45] Date of Patent: Jun. 13, 2000

[54] RING OSCILLATOR TEST STRUCTURE

[75] Inventors: Jon Cheek, Round Rock; Antonio Garcia, Austin; John Bush, Leander, all of Tex.

[73] Assignee: Advanced Micro Devices, Inc., Sunnyvale, Calif.

[21] Appl. No.: 09/002,655

[22] Filed: Jan. 5, 1998

[51] Int. Cl.[7] .............................. H03B 5/24; G01R 31/00
[52] U.S. Cl. .................... 331/44; 331/57; 331/64; 331/108 C; 324/76.11
[58] Field of Search .................. 331/44, 57, 64, 331/108 C, 108 D, 187, DIG. 3; 324/76.11, 76.39

[56] References Cited

U.S. PATENT DOCUMENTS 4,425,553   1/1984   LaPierre ................................... 331/74

OTHER PUBLICATIONS

Schuster, S.E. et al; "On–Chip Test Circuitry for a 2–ns Cycle, 512—kb CMOS ECL SRAM"; IEEE Journal of Solid–State Circuits; vol. 27; No. 7; Jul. 1992; pp. 1073–1079; 331/57, Jul. 1992.

Primary Examiner—David Mis

[57] ABSTRACT

An improved oscillator test structure is disclosed. A structure according to one embodiment includes an odd plurality of first transistor pairs formed on a predetermined area of a semiconductor substrate. The transistor pairs are electrically connected in a serial ring. The structure also includes at least one second transistor pair, also formed within the predetermined area on the substrate, but electrically isolated from the odd plurality of first transistor pairs.

19 Claims, 2 Drawing Sheets

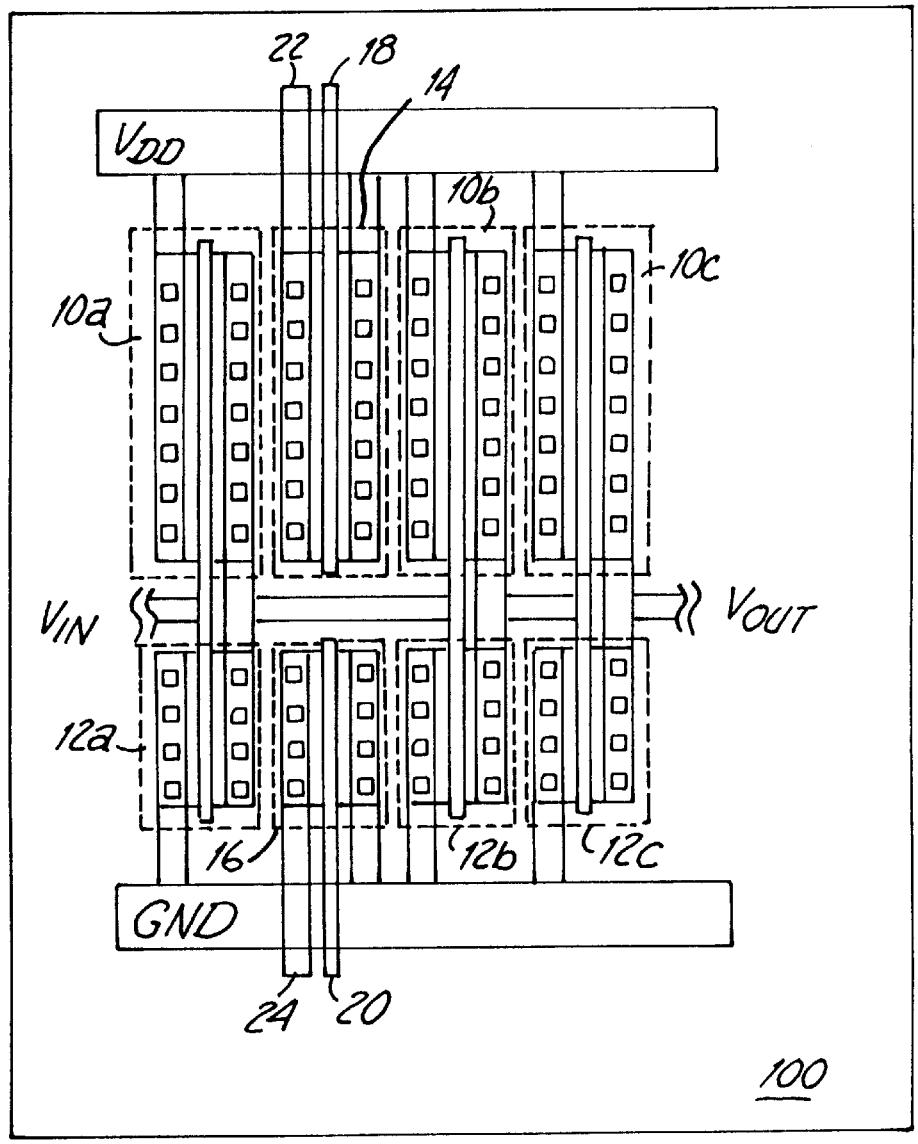
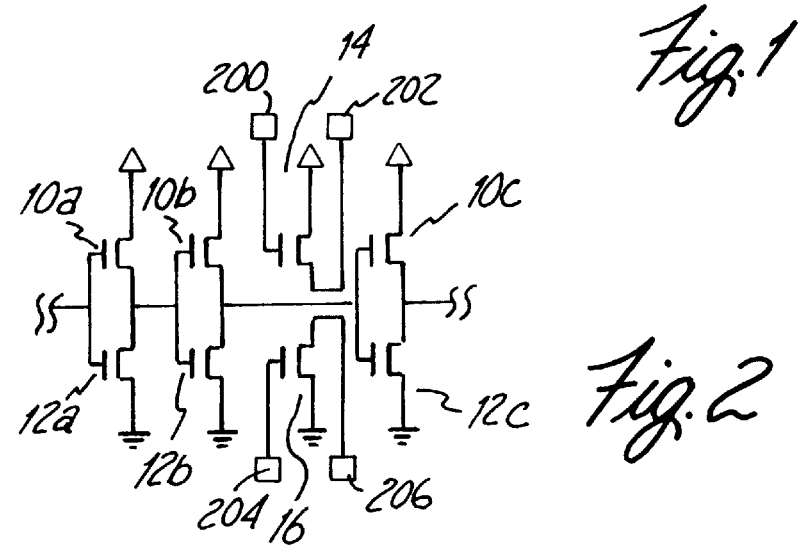

RING OSCILLATOR TEST STRUCTURE

FIELD OF THE INVENTION

The present invention relates generally to integrated circuits and more particularly to an improved ring oscillator test structure.

BACKGROUND OF THE INVENTION

An insulated-gated field-effect transistor (IGFET), such as a metal-oxide semiconductor field-effect transistor (MOSFET), uses a gate to control an underlying surface channel joining a source and a drain. The channel, source and drain are located within a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

Typically within a semiconductor device, such as microprocessor for a computer, there are literally thousands of IGFETs. Designing such devices, therefore, is a complicated process, and requires the utmost care and sophistication. To assist in testing, a device may have fabricated therein a test structure. For example, a common test structure used to determine circuit speed is the ring oscillator. A ring oscillator is an odd number of inverters connected serially, with the output of the last stage connected back into the input of the first stage. When powered, this circuit starts to oscillate as a result of it driving itself. Because the output drives the input of this circuit, the oscillation speed is the highest possible for a given design.

A disadvantage to prior art ring oscillators is that the ring oscillator's speed gives only a qualitative indication of circuit speed, not a quantitative measure of speed. To more accurately determine true performance, circuit designers require electrical parameters for the individual transistors making up the circuit to be measured. Therefore, prior art devices including ring oscillators usually include individual transistors fabricated at different locations on the die from the ring oscillators. The electrical parameters or characteristics of these transistors are then substituted for the characteristics of the transistors embedded within the oscillator.

However, this approach does not yield a very accurate model of the characteristics of the transistors used to make the ring oscillators. While the isolated transistors may be designed to be identical to the embedded transistors, external variables cannot easily be taken into account. For example, the embedded transistors are typically packed very dense, and this density may have effects on the electrical characteristics of the embedded transistors within an oscillator that cannot easily be duplicated on the isolated transistors falsely assumed to be identical to the embedded transistors. There is a need, therefore, for better measurement of the electrical characteristics of the individual transistors making up a ring oscillator test structure.

SUMMARY OF THE INVENTION

The above-mentioned shortcomings, disadvantages and problems are addressed by the present invention, which will be understood by reading and studying the following specification. The invention relates to an improved oscillator test structure. An inventive such structure according to one embodiment includes an odd plurality of first transistor pairs formed on a predetermined area of a semiconductor substrate. The transistor pairs are electrically connected in a serial ring. The structure also includes at least one second transistor pair, also formed within the predetermined area on the substrate, but electrically isolated from the odd plurality of first transistor pairs.

Because the electrically isolated one or more second transistor pairs are fabricated within the same area as are the odd plurality of first transistor pairs that are connected to one another in a serial ring, the electrical characteristics of the one or more second transistor pairs better approximate the electrical characteristics of the embedded first transistor pairs, allowing for more accurate circuit performance measurement. That is, rather than being located apart from the embedded transistor pairs on the die, as in the prior art, the electrically isolated transistor pair or pairs in one embodiment of the invention are located in the same area as are the embedded transistor pairs. Thus, insofar as the embedded transistor pairs are affected by externalities such as their density, the electrical isolated transistor pair or pairs are affected likewise. This is an advantage of the invention.

The present invention describes methods, devices, and computerized systems of varying scope. In addition to the aspects and advantages of the present invention described here, further aspects and advantages of the invention will become apparent by reference to the drawings and by reading the detailed description that follows.

BRIEF DESCRIPTION OF THE DRAWINGS

FIG. 1 shows a layout of a ring oscillator test structure, in accordance with one embodiment of the invention;

FIG. 2 shows an electrical schematic of a ring oscillator test structure, in accordance with one embodiment of the invention; and, FIG. 3 is a diagram of a computerized system, in accordance with which the invention may be implemented.

DETAILED DESCRIPTION OF THE INVENTION

Figure 3:
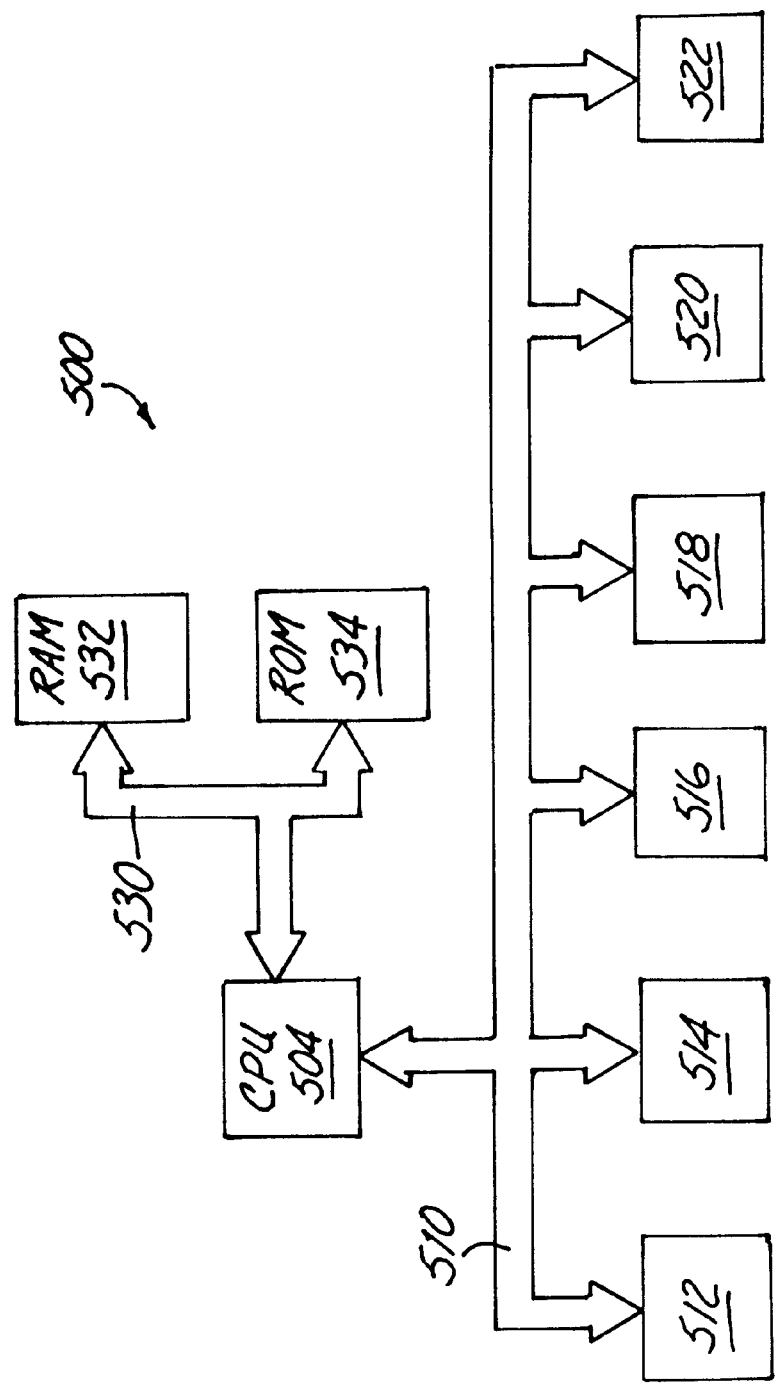

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Referring first to FIG. 1, a layout of a ring oscillator test structure, in accordance with one embodiment of the invention, is shown. The layout of FIG. 1 represents the minimum spacing that is possible in terms of transistor placement; that is, the transistors within FIG. 1 have a very high density. The structure is fabricated within semiconductor substrate 100. The ring oscillator structure of FIG. 1 is made up of three transistor pairs acting as inverters: p-channel transistor 10a and n-channel transistor 12a making up a first transistor pair, p-channel transistor 10b and n-channel transistor 12b making up a second transistor pair, and p-channel transistor 10c and n-channel transistor 12c making up a third transistor pair.

The source of each of p-channel transistors 10a, 10b and 10c are coupled to Vdd, the drain of each of p-channel transistors 10a, 10b and 10c are coupled to the drain of corresponding n-channel transistors 12a, 12b and 12c, respectively, and the source of each of n-channel transistors 12a, 12b and 12c are coupled to ground. The gates of transistors 10a and 12a are connected to Vin. The gates of transistors 10b and 12b are connected to the drain of transistor 10a and the drain of transistor 12a. The gates of transistors 10c and 12c are connected to the drain of transistor 10b and the drain of transistor 12b. Vout is connected to the drain of transistor 10c and the drain of transistor 12c. Vout is connected to Vin, not shown in FIG. 1.

An electrically isolated transistor pair is made up of p-channel transistor 14 and n-channel transistor 16. This transistor pair is isolated from the transistor pairs consisting of transistors 10a, 10b, 10c, 12a, 12b and 12c. The source of p-channel transistor 14 is connected to Vdd, and the source of n-channel transistor 16 is connected to ground, just like transistors 10a, 10b, 10c, 12a, 12b and 12c. However, the gates of transistors 14 and 16 are extended to points 18 and 20, respectively, where they may be coupled to bonding pads (not shown) for probing. Likewise, the drain of transistor 14 and the drain of transistor 16 are extended to points 22 and 24, respectively, where they may also be coupled to bonding pads (not shown) for probing.

Thus, as shown in FIG. 1, the electrically isolated transistors 14 and 16 are fabricated in the same predetermined area as the transistors embedded in the ring oscillator (10a, 10b, 10c, 12a, 12b and 12c) are. The electrical characteristics of these transistors therefore approximate closely the electrical characteristics of the transistors 10a, 10b, 10c, 12a, 12b and 12c, inasmuch as the externalities affecting these latter transistors affect the former transistors, too. Therefore, by probing points 18, 20, 22 and 24, a circuit designer is able to approximate the electrical characteristics of the transistors making up the ring oscillator test structure.

As shown in FIG. 1, there is only one electrically isolated transistor pair, and this pair has desirably identical electrical characteristics to the electrical characteristics of the embedded transistor pairs, because the isolated transistor pair has the same width and length as does the embedded transistor pairs. The invention is not so limited in either of these regards, though. For example, there may be more than one electrically isolated transistor pair. For further example, each of these isolated transistor pairs may have different widths (but the same length) or different lengths (but the same width) than does the embedded transistor pairs. This latter example provides for approximating actual processing conditions, as opposed to ideal processing conditions, such that the electrical conditions characteristics of the isolated transistor pairs are different than those of the embedded transistor pairs.

Furthermore, as shown in FIG. 1, there are only three transistor pairs making up the actual ring oscillator. This is for purposes of clarity, only; those of ordinary skill in the art will appreciate that typically many more transistor pairs than three making up a ring oscillator. For example, in one embodiment of the invention, fifty-one transistor pairs making up the oscillator, while in another embodiment, one-hundred-one pairs make up the oscillator.

Referring next to FIG. 2, an electrical schematic of a ring oscillator test structure, in accordance with one embodiment of the invention, is shown. Similar to the ring oscillator of FIG. 1, transistor pairs made up of p-channel transistor 10a and n-channel transistor 12a, p-channel transistor 10b and n-channel transistor 12b, and p-channel transistor 10c and n-channel transistor 12c make up the ring oscillator, while p-channel transistor 14 and n-channel transistor 16 are electrically isolated from the ring oscillator, although they are fabricated within the same predetermined area as the ring oscillator. Bonding pads 200, 202, 204 and 206, coupled to the gate of transistor 14, the drain of transistor 14, the gate of transistor 16, and the drain of transistor 16, respectively, permit easy probing of transistors 14 and 16 to determine its electrical characteristics.

Thus, by being able to measure the transistors 14 and 16, the almost exact electrical parameters of transistors 10a, 10b, 10c, 12a, 12b and 12c can be determined. Phenomena such as poly etch density loading effects, reticle locations effects, and implant angle shadowing, can be normalized for because measured devices and embedded devices have the same processing. Furthermore, not only can single transistors be measured, but as has been described, multiple transistors of different sizes can be fabricated, providing sufficient data to calculate effects due to processing conditions, etc.

Referring finally to FIG. 3, advantageously the invention is well-suited for use in a device such as an integrated circuit chip, as well as an electronic system including a central processing unit, a memory and a system bus. The electronic system may be a computerized system 500 as shown in FIG. 3. The system 500 includes a central processing unit 500, a random access memory 532, and a system bus 530 for communicatively coupling the central processing unit 504 and the random access memory 532. The system 500 includes a device having a test structure as has been described. The system 500 may also include an input/output bus 510 and several peripheral devices, such as devices 512, 514, 516, 518, 520 and 522, which may be attached to the input/output bus 510. Peripheral devices may include hard disk drives, floppy disk drives, monitors, keyboards, and other such peripherals.

An improved ring oscillator test structure has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the following claims and equivalents thereof.

We claim:

1. An oscillator test structure comprising:
    a semiconductor substrate;
    an odd plurality of first transistor pairs formed within a predetermined area of the substrate and electrically connected in a serial ring; and,
    at least one second transistor pair formed on the substrate within the predetermined area but electrically isolated from the odd plurality of first transistor pairs.

2. The test structure of claim 1, wherein each of the odd plurality of first transistor pairs has identical electrical characteristics.

3. The test structure of claim 2, wherein each of the at least one second transistor pair has identical electrical characteristics to the electrical characteristics of the odd plurality of first transistor pairs.

4. The test structure of claim 2, wherein each of the at least one second transistor pair has different electrical characteristics than the electrical characteristics of the odd plurality of first transistor pairs.

5. The test structure of claim 1, wherein the odd plurality of first transistor pairs consists of fifty-one transistor pairs.

6. The test structure of claim 1, wherein the odd plurality of first transistor pairs consists of one-hundred-one transistor pairs.

7. The test structure of claim 1, wherein the at least one second transistor pair consists of one transistor pair.

8. The test structure of claim 1, wherein each of the at least one second transistor pair and each of the odd plurality of first transistor pairs comprises a p-channel transistor and an n-channel transistor.

9. The test structure of claim 1, further comprising a plurality of probe points formed on the substrate, each probe point coupled to one of a gate, a drain, and a source of one of the at least one second transistor pair.

10. The test structure of claim 9, wherein each probe point comprises a bonding pad.

11. A method for forming an oscillator test structure comprising:

providing a semiconductor substrate;

forming an odd plurality of first transistor pairs within a predetermined area of the substrate and electrically connected in a serial ring; and, forming at least one second transistor pair within the predetermined area on the substrate but electrically isolated from the odd plurality of first transistor pairs.

12. The method of claim 11, further comprising forming a plurality of probe points on the substrate, each probe point coupled to one of a gate, a drain, and a source of one of the at least one second transistor pair.

13. The method of claim 11, wherein each of the odd plurality of first transistor pairs has identical electrical characteristics.

14. The method of claim 13, wherein each of the at least one second transistor pair has identical electrical characteristics to the electrical characteristics of the odd plurality of first transistor pairs.

15. The method of claim 13, wherein each of the at least one second transistor pair has different electrical characteristics than the electrical characteristics of the odd plurality of first transistor pairs.

16. The method of claim 11, wherein each of the at least one second transistor pair and each of the odd plurality of first transistor pairs comprises a p-channel transistor and an n-channel transistor.

17. A computerized system comprising at least one ring oscillator test structure, each structure comprising:

a semiconductor substrate;

an odd plurality of first transistor pairs formed within a predetermined area of the substrate and electrically connected in a serial ring; and, at least one second transistor pair formed on the substrate within the predetermined area but electrically isolated from the odd plurality of first transistor pairs.

18. The system of claim 17, wherein each structure further comprises a plurality of probe points formed on the substrate, each probe point coupled to one of a gate, a drain, and a source of one of the at least one second transistor pair.

19. The system of claim 17, wherein each of the at least one second transistor pair and each of the odd plurality of first transistor pairs of each structure comprises a p-channel transistor and an n-channel transistor.

* * * * *